United States Patent
Kim et al.

(10) Patent No.: US 8,987,864 B2
(45) Date of Patent: Mar. 24, 2015

(54) ARRAY TYPE CHIP RESISTOR AND METHOD OF MANUFACTURING THEREOF

(71) Applicant: Samsung Electro-Mechanics Co., Ltd., Suwon, Gyunggi-do (KR)

(72) Inventors: Jung Il Kim, Gyunggi-do (KR); Ha Sung Hwang, Gyunggi-do (KR); Hae In Kim, Gyunggi-do (KR); Ichiro Tanaka, Gyunggi-do (KR); Oh Sung Kwon, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 0 days.

(21) Appl. No.: 14/018,801

(22) Filed: Sep. 5, 2013

(65) Prior Publication Data

US 2014/0361405 A1 Dec. 11, 2014

(30) Foreign Application Priority Data

Jun. 5, 2013 (KR) .................. 10-2013-0064483

(51) Int. Cl.
  *H01L 29/00* (2006.01)
  *H01L 49/02* (2006.01)

(52) U.S. Cl.
  CPC ..................... *H01L 28/20* (2013.01)
  USPC ........... 257/536; 438/382; 338/260; 338/333; 338/204; 338/258; 338/276; 338/332

(58) Field of Classification Search
  CPC .......... H01L 28/20; H01C 7/006; H01C 7/18; H01C 1/034; H01C 1/14
  USPC ........... 257/536; 438/382; 338/260, 333, 204, 338/258, 276, 332
  See application file for complete search history.

(56) References Cited

U.S. PATENT DOCUMENTS 8,149,082 B2 * 4/2012 Hirasawa et al. ............. 338/226
2006/0220783 A1 10/2006 Kuriyama
(Continued)

FOREIGN PATENT DOCUMENTS

CN 202736613 U 2/2013
JP 9-306709 A 11/1997
(Continued)

OTHER PUBLICATIONS

Japanese Office Action issued in Japanese Application No. 2013-169093 dated Aug. 19, 2014, w/English translation.
(Continued)

*Primary Examiner* — Tu-Tu Ho
(74) *Attorney, Agent, or Firm* — McDermott Will & Emery LLP (57) ABSTRACT

There is provided an array type chip resistor including: a chip body, four pairs of lower electrodes disposed on both sides of a lower surface of the chip body and formed so as to be extended to edges of the chip body, side electrodes formed so that the lower electrodes are extended to sides of the chip body, and a resistor interposed between the lower electrodes on the lower surface of the chip body and electrically connected to the lower electrode through a contact portion, wherein when a width of the side electrode is defined as d1, a distance between adjacent side electrodes is defined as d2, and a height of the side electrode is defined as h, in the case in which d1/d2 is 0.5 to 1.5, a value of h is 4,300/d1 μm or above and is 0.24d2+87.26 μm or less.

15 Claims, 5 Drawing Sheets

A-A'

(56) References Cited

U.S. PATENT DOCUMENTS

| | | |
|---|---|---|
| 2010/0060409 A1 | 3/2010 | Smith et al. |
| 2011/0057765 A1 | 3/2011 | Ryu et al. |
| 2011/0057767 A1 | 3/2011 | Ryu et al. |
| 2012/0134067 A1 | 5/2012 | Si et al. |

FOREIGN PATENT DOCUMENTS

| | | |
|---|---|---|
| JP | 2001-358034 A | 12/2001 |
| JP | 2007-053135 A | 3/2007 |
| JP | 2012-114395 A | 6/2012 |
| KR | 10-2006-0106647 A | 10/2006 |
| KR | 10-2011-0025452 A | 3/2011 |
| KR | 10-2011-0025453 A | 3/2011 |
| TW | 1394175 B | 4/2013 |

OTHER PUBLICATIONS

Taiwanese Examination Report issued in corresponding Taiwanese Application No. 102129101, dated Jul. 21, 2014, with English translation.

Office Action issued on Jun. 25, 2014 in the corresponding Korean patent application No. 10-2013-0064483.

* cited by examiner

ARRAY TYPE CHIP RESISTOR AND METHOD OF MANUFACTURING THEREOF

CROSS-REFERENCE TO RELATED APPLICATIONS

This application claims the priority of Korean Patent Application No. 10-2013-0064483 filed on Jun. 5, 2013, in the Korean Intellectual Property Office, the disclosure of which is incorporated herein by reference.

BACKGROUND OF THE INVENTION

1. Field of the Invention

The present invention relates to an array type chip resistor and a method of manufacturing thereof, and more particularly, to an array type chip resistor capable of securing adhesion strength and having improved reliability and a method of manufacturing thereof.

2. Description of the Related Art

An array type chip resistor is suitable for implementing a precision resistor and demand therefor for use in various electronic devices such as camcorders, digital cameras, and motor vehicles has expanded.

In general, a memory module resistor, having an array type chip resistor form, is mounted adjacently to an external connection terminal of a module substrate.

The array type chip resistor serves to adjust a current and to drop a voltage within an entire circuit.

A general chip resistor has a structure as follows. In the case of a chip resistor, a resistor is formed on an insulation substrate by the sputtering, depositing, or the like of a material such as nickel chrome (NiCr), and a side electrode connected to the resistor and formed on both sides of the insulation substrate may be provided. In addition, a protection layer formed of a material such as glass or a resin polymer to protect the resistor is formed over the resistor.

A method of mounting the array type chip resistor on the module substrate of the semiconductor memory module includes a method of mounting the array type chip resistor to allow a surface having a resistor body face upwardly and a method of mounting the array type chip resistor to allow a surface having a resistor body to face downwardly.

In the case in which the array type chip resistor is mounted to allow the resistor body to face upwardly, a resistor portion is exposed, such that the resistor portion or an electrode portion may be easily susceptible to physical damage during an assembly process or during user handling. Therefore, the electrode may be stripped or the resistor may be broken, such that an electrical open defect may be generated.

Therefore, in order to solve the problem as described above, a method of mounting a plating layer by allowing the surface having the resistor body to face downwardly may be used.

Particularly, in the case in which the array type chip resistor having a mounting configuration in which the surface having the resistor body faces downwardly is mounted on the substrate, the plating layer is formed on a surface of the side electrode so as to be electrically connected to the array type chip resistor and the array type chip resistor may be adhered to the substrate.

According to the related art, the side electrodes are formed so as to be extended from the resistor body on a lower surface of the array type chip resistor onto portions of the side and upper surfaces thereof in a "⊏" form at both ends of the array type chip resistor in a length direction, and are electrically connected to the resistor.

Therefore, in the case in which a physical impact or damage is applied to the array type chip resistor during the assembly process or during handling by a user, the electrode disposed on the array type chip resistor is in contact with an adjacent electrode, such that electrical shorts may be generated or the array type chip resistor may be separated from the substrate.

Particularly, in order to mount the array type chip resistor on the substrate, the plating layer is formed on an upper part of the side electrode, wherein the plating layer is relatively soft, such that it is likely to contact the adjacent electrode when an impact is applied thereto from the outside.

Therefore, in order to solve the problem in which the array type chip resistor is separated from the substrate, a scheme capable of securing adhesion strength and solving the problem in which shorts are generated due to contact between adjacent electrodes has been demanded.

The following Related Art Document relates to an array type chip resistor. However, the above-mentioned patent document does not disclose a relationship between an interval between adjacent side electrodes and heights thereof.

RELATED ART DOCUMENT

Korean Patent Laid-Open Publication No. 2011-0025452

SUMMARY OF THE INVENTION

An object of the present invention provides an array type chip resistor capable of securing adhesion strength and preventing shorts which may be generated between adjacent side electrodes, and a method of manufacturing thereof.

According to an aspect of the present invention, there is provided an array type chip resistor, including: a chip body; four pairs of lower electrodes disposed on both sides of a lower surface of the chip body and formed so as to be extended to edges of the chip body; side electrodes formed so that the lower electrodes are extended to sides of the chip body; and a resistor interposed between the lower electrodes on the lower surface of the chip body and electrically connected to the lower electrode through a contact portion, wherein when a width of the side electrode is defined as d1, a distance between adjacent side electrodes is defined as d2, and a height of the side electrode is defined as h, in the case in which d1/d2 is 0.5 to 1.5, a value of h is 4,300/d1 μm or above and is 0.24d2+87.26 μm or less.

The chip body may have a length of 1400 μm.

The side electrode may have the width d1 of 140 to 233 μm.

The distance d2 between adjacent side electrodes may be 200 to 400 μm.

The contact portion may have the resistor formed below the lower electrode.

The contact portion may have the lower electrode formed below the resistor.

The array type chip resistor may further include: a protection layer covering the resistor and having both sides simultaneously covering a portion of the lower electrode; a leveling electrode being in contact with the lower electrode exposed to an outer side of the protection layer; a plating layer formed on the leveling electrode; and an insulating layer covering the protection layer on the underside thereof.

A width of the side electrode disposed on an end of the chip body and a width of the side electrode disposed in the center portion among the four pairs of side electrodes may be different from each other.

According to an aspect of the present invention, there is provided an array type chip resistor, including: a chip body;

two pairs of lower electrodes disposed on both sides of a lower surface of the chip body and formed so as to be extended to edges of the chip body; side electrodes formed so that the lower electrodes are extended to sides of the chip body; and a resistor interposed between the lower electrodes on the lower surface of the chip body and electrically connected to the lower electrode through a contact portion, wherein when a width of the side electrode is defined as d1, a distance between adjacent side electrodes is defined as d2, and a height of the side electrode is defined as h, in the case in which d1/d2 is 0.5 to 1.5, a value of h is 7,000/d1 μm or above and is 0.15d2+105 μm or less.

The chip body may have a length of 800 μm.

The side electrode may have the width d1 of 200 to 300 μm.

The distance d2 between adjacent side electrodes may be 200 to 400 μm.

The contact portion may have the resistor formed below the lower electrode.

The contact portion may have the lower electrode formed below the resistor.

The array type chip resistor may further include: a protection layer covering the resistor and having both sides simultaneously covering a portion of the lower electrode; a leveling electrode being in contact with the lower electrode exposed to an outer side of the protection layer; a plating layer formed on the leveling electrode; and an insulating layer covering the protection layer on the underside thereof.

According to an aspect of the present invention, there is provided a method of manufacturing an array type chip resistor, the method including: preparing a substrate; printing a lower electrode and a resistor on a lower surface of the substrate; etching an upper surface of the substrate at a predetermined height so as to have a shape in which two or four pairs of lower electrodes are included; forming an upper masking layer on the upper surface of the etched substrate; preparing a chip body by dividing the substrate having the upper masking layer formed thereon according to the shape formed by etching; stacking the chip body; and forming side electrodes on both sides of the stacked chip body to be extended from the lower electrodes.

The forming of the side electrodes may include: forming a side masking layer between adjacent side electrodes; and forming the side electrodes at the side of the stacked chip body having the upper masking layer formed thereon.

The method may further include removing the upper masking layer and the side masking layer.

In a case of etching the upper surface of the substrate at a predetermined height so as to have a shape in which four pairs of lower electrodes are included, when a width of the side electrode is defined as d1, a distance between adjacent side electrodes is defined as d2, a height of the side electrode is defined as h, and a thickness of the substrate is defined as t, the etched height of the substrate may be t−(0.24d2+87.26) μm or above and may be t−(4,300/d1) μm or less.

In a case of etching the upper surface of the substrate at a predetermined height so as to have a shape in which two pairs of lower electrodes are included, when a width of the side electrode is defined as d1, a distance between adjacent side electrodes is defined as d2, a height of the side electrode is defined as h, and a thickness of the substrate is defined as t, the etched height of the substrate may be t−(0.15d2+105) μm or above and may be t−(7,000/d1) μm or less.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

Figure 1:
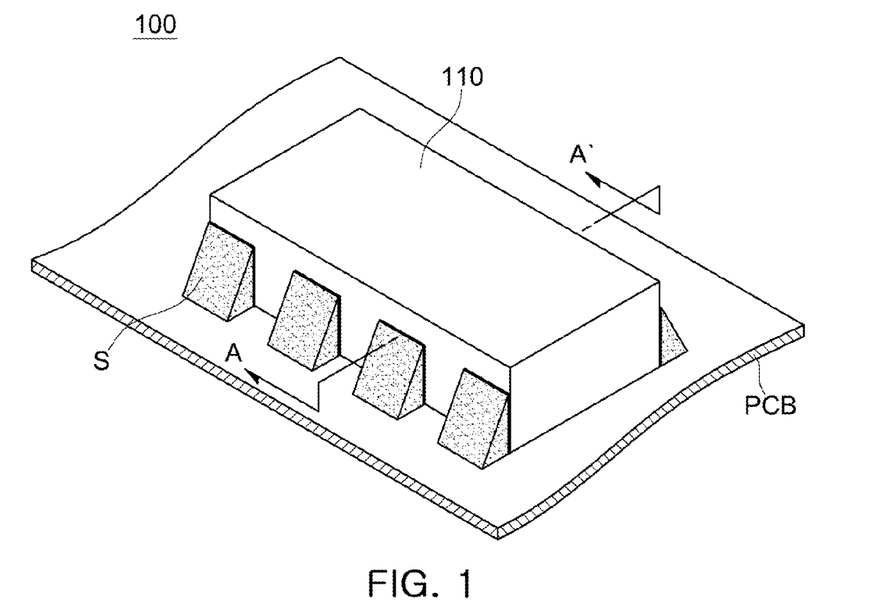
FIG. 1 is a schematic perspective view of an array type chip resistor according to an embodiment of the present invention.
Figure 2:
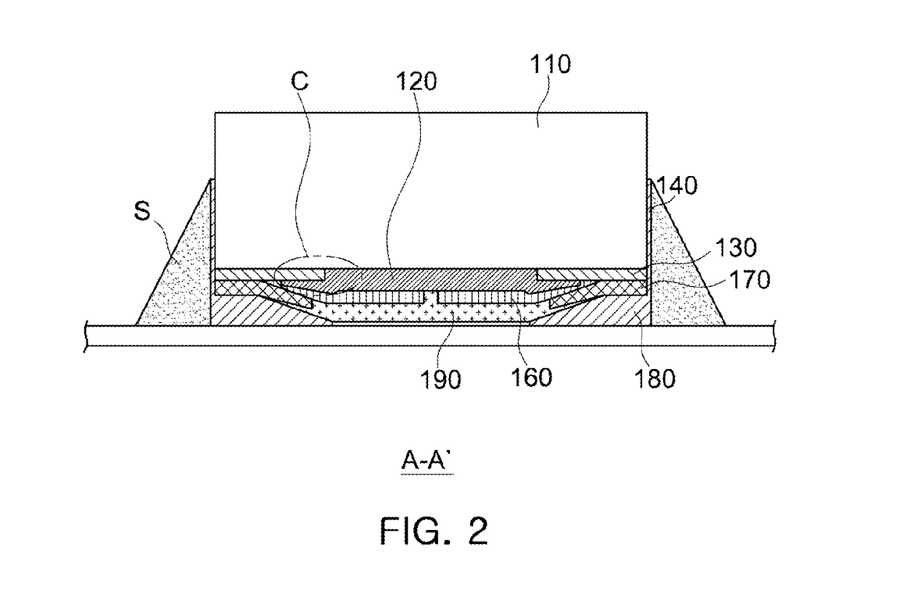
FIG. 2 is a schematic cross-sectional view taken along line A-A' of the array type chip resistor of FIG. 1.

FIG. 1 is a schematic perspective view of an array type chip resistor according to an embodiment of the present invention and FIG. 2 is a schematic cross-sectional view taken along line A-A' of the array type chip resistor of FIG. 1.

The array type chip resistor according to the embodiment of the present invention will be described with reference to FIGS. 1 and 2.

The array type chip resistor 100 according to the embodiment of the present invention may include a chip body 110; four pairs of lower electrodes 130 disposed on both sides of a lower surface of the chip body 110 and formed so as to be extended to edges of the chip body 110; side electrodes 140 formed by allowing the lower electrodes 130 to be extended to sides of the chip body; and a resistor 120 interposed between the lower electrodes 130 on the lower surface of the chip body and electrically connected to the lower electrodes 130 through a contact portion C.

As shown, the chip body 110 according to the embodiment of the present invention may be configured to have a thin plate shape having a rectangular parallelepiped shape and may be formed of an alumina material of which a surface is anodized so as to be insulated.

In addition, as the chip body 110 is formed of a material having excellent heat conductivity, the chip body 110 serves as a thermal diffusion passage radiating heat generated by the resistor 120 at the time of performing surface mounting of the chip body 110.

The chip body 110 may have the rectangular parallelepiped shape, but is not limited thereto.

The chip body 110 may have a length l of 1400 μm.

The chip body 110 may have a thickness t of 180 μm.

The lower surface of the chip body 110 is provided with a plurality of lower electrodes 130 disposed with predetermined intervals therebetween on both sides of the lower surface.

The resistor 120 mainly having ruthenium oxide (RuO) as a main component thereof is printed on the center portion of the chip body 110, inwardly of the lower electrodes 130.

In this case, the resistor 120 and the plurality of lower electrodes 130 disposed at the outside thereof are electrically connected to one another through the contact portion C.

When the resistor 120 is printed inwardly of the lower electrodes 130 formed on both sides of the lower surface of the chip body 110, the resistor may be printed so as to cover the portion of the lower electrodes 130 in order to stably and electrically connect the resistor 120 and the lower electrodes 130.

In addition, when mounting the array type chip resistor 100 on a printed circuit board (PCB), the lower electrodes 130 face a pad formed on the PCB so as to be electrically adhered through a solder S.

Meanwhile, a protection layer 160 for protecting the resistor 120 from external impact may cover the resistor 120 printed so as to have a predetermined thickness between the lower electrodes 130.

In this case, the protection layer 160 may be formed of a silicon dioxide ($SiO_2$) or glass and may be formed on the resistor 120 by over-coating.

The protection layer 160 is formed on an exposed entire surface of the resistor 120 for the purpose of protecting the resistor 120, but in order to completely seal the resistor 120, a portion inwardly of the lower electrodes 130 provided at the outside of the resistor 120 may also be simultaneously covered.

The resistor 120 having the protection layer 160 formed thereon, which implements resistive characteristics by interrupting a current flow through the array type chip resistor 100 at the time of the surface mounting, needs to implement a suitable capacitance value and may have a resistance value of a suitable capacitance by performing a laser trimming process in order to enable the implementation of the suitable capacitance value after forming the protection layer 160.

That is, when the resistance value which may be implemented in the array type chip resistor 100 is 100Ω, since it is difficult to form the resistor 120 having a precise 100Ω at the time of printing the resistor 120, the resistor 120 is formed so as to implement a resistance value of approximately 80 to 90Ω, and a groove portion having an etched shape is formed by trimming the resistor 120 using the laser, such that the resistance value is increased and 100Ω of a design value may be implemented.

In this case, the reason that the protection layer 160 is formed on the resistor 120 and the trimming of the resistor 120 is then performed is to prevent cracking of the resistor 120 by the protection layer 160 at the time of the laser trimming process.

After forming the protection layer 160 covering the resistor 120, leveling electrodes 170 electrically contacting the lower electrodes 130 are provided.

The leveling electrode 170 may be formed on the lower electrodes 130 and the edge of the protection layer 160 covering the portion of the lower electrodes 130, and serves to enable a stable electrode contact by expanding a reduced effective area of the lower electrodes 130.

In addition, the leveling electrode 170 is formed on the lower electrodes 130 so as to have a predetermined height and the reason for forming the leveling electrode 170 in addition to the lower electrodes 130 is to increase a height of a final electrode above a height of an insulating layer (described below) in addition to the resistor 120 printed on the lower surface of the chip body 110 and the protection layer 160.

That is, the leveling electrode 170 is to match the height thereof to the approximately same height as the heights of the resistor 120 and the protection layer 160 formed on the center portion of the lower surface of the chip body 110 and to be in contact with the reduced effective area of the lower electrodes 130 at the time of forming the resistor 120 and the protection layer 160 to expand the area of the electrode, such that stability of the electrode is easily secured and a plating layer is then easily formed.

Meanwhile, the plating layer 180 is formed on the leveling electrode 170, for forming the final external electrode.

The plating layer 180 may be formed by sequentially performing nickel (Ni) plating and tin (Sn) plating, and the plating layer 180 may be formed through electroplating or electroless plating.

In this case, the nickel plating layer is a plating layer for protecting the leveling electrode 170 at the time of soldering and the tin plating layer is formed for easy soldering at the time of soldering.

In addition, the array type chip resistor 100 according to the embodiment of the present invention may further include an insulating layer 190 covering an entire protection layer 160 at the time of forming the external electrode using the plating layer 180. The insulating layer 190 may be formed of a glass or polymer material similar to the protection layer 160 and finally serves to protect the resistor 120.

In addition, the insulating layer 190 completely blocks the resistor 120 from being exposed to the outside to protect the resistor 120 from the external impact and covers the entire surface of the protection layer 160 and a portion of the leveling electrode 170 which is an additional electrode, such that when forming the plating layer 180 for forming the external electrode, a plating liquid may be prevented from being permeated into the resistor 120.

In this case, the plating layers 180 formed on both side portions of the insulating layer 190 may be formed so as to have a height greater than that of the center portion of the insulating layer 190.

The reason forming the height of the plating layer 180 of both side portions of the insulating layer 190 to be relatively high is to enable stable mounting at the time of mounting the array type chip resistor 100 on a main substrate (PCB) according to the embodiment of the present invention, and more specifically, to prevent a Tombstone defect from being generated, wherein the Tombstone defect indicates that the array type chip resistor 100 on the PCB is mounted to be inclined toward one side by a convex portion of the center at the time of soldering the array type chip resistor 100 in the case in which the convex center portion of the insulating layer 190 is formed to be higher than the plating layer 180.

Figure 3A:
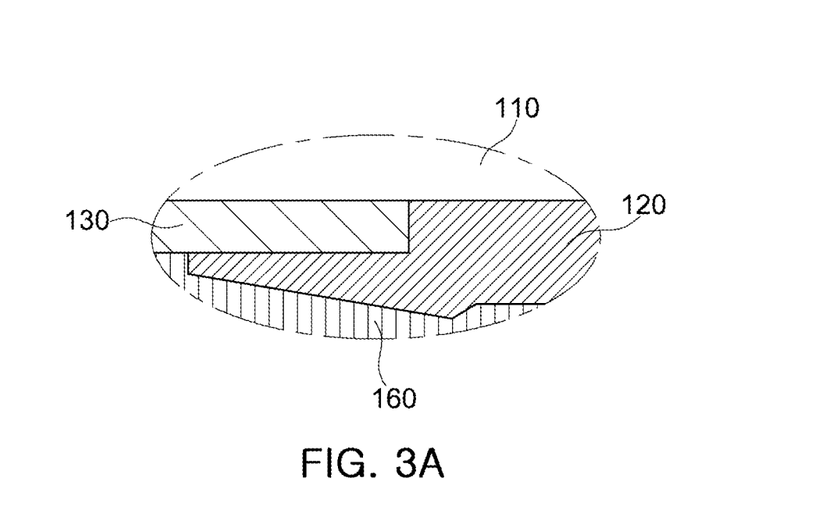
FIGS. 3A and 3B are enlarged views of part C of FIG. 2.
Figure 3B:
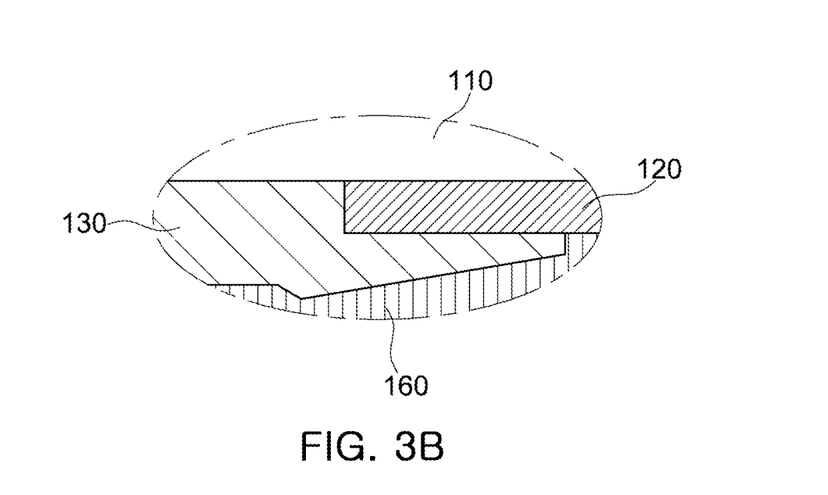

FIGS. 3A and 3B are enlarged views of part C of FIG. 2. Referring to FIG. 3A, in the contact portion C, the resistor 120 may be formed below the lower electrodes 130.

In the case in which the lower electrodes 130 are formed as shown in FIG. 3A, a resistance of the resistor 120 is easily formed so as to close to a design value by forming the resistor 120 after printing the lower electrodes 130.

In addition, referring to FIG. 3B, in the contact portion C, the lower electrodes 130 may be formed below the resistor 120.

In the case in which the lower electrodes 130 are formed as shown in FIG. 3B, an electrical connection between the resistor 120 and the lower electrodes 130 may be easily performed by forming the lower electrodes 130 after printing the resistor 120.

Figure 4:
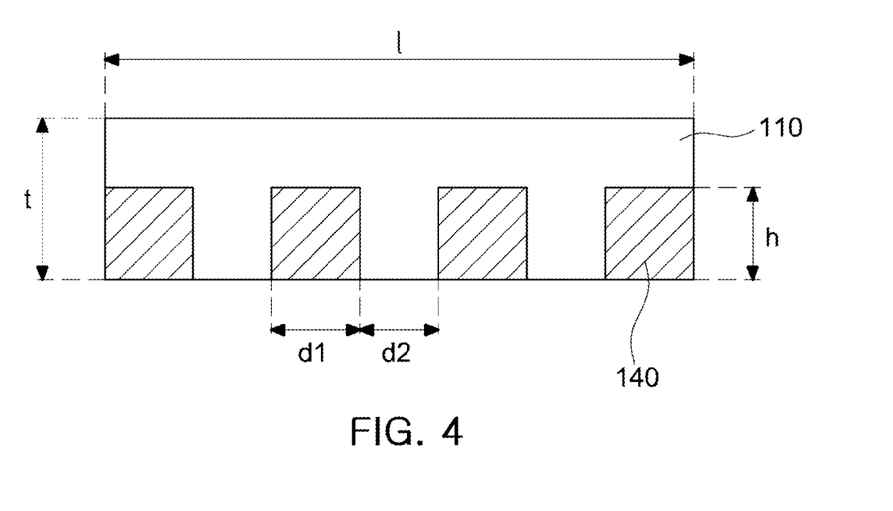
FIG. 4 is a schematic side view in a length direction 1 of the array type chip resistor of FIG. 1.

FIG. 4 is a schematic side view in a length direction 1 of the array type chip resistor of FIG. 1.

When a width of the side electrode 140 is defined as d1 and a distance between the side electrodes 140 adjacent to each other is defined as d2, a height of the side electrode 140 may be defined as h.

In this case, a relationship for the height of the side electrode 140 according to the width d1 of the side electrode 140 and the distance d2 between the side electrodes 140 adjacent to each other will be described in the following table 1.

A short test and a short test by a solder between the electrodes are indicated as X in the case in which shorts are generated and are indicated as O in the case in which shorts are not generated, at the time of testing the short by external forcible impact.

The adhesion strength is indicated as X in the case in which at least one of 10 samples is separated, and is indicated as O in the case in which no samples are separated, when force of 800 gf or 1,500 gf is applied to the array type chip resistor 100 attached to the PCB.

Referring to table 1, it may be appreciated that as the height of the side electrode 140 becomes high, the adhesion strength is increased in the case in which forces of 800 gf and 1500 gf are applied.

Particularly, when one side electrode 140 has an area of 4,300 μm² or more, even when the force of 1500 gf is applied,

TABLE 1

| Division | d1/d2 | h (um) | d1 (um) | d2 (um) | L (um) | Sokler Short | Short | 800gf Adhesion Strength | 1500gf Adhesion Strength |
|---|---|---|---|---|---|---|---|---|---|
| Four Pairs | 0.5 | 10 | 140 | 280 | 1,400 | O | O | X | X |
| | | 20 | | | | O | O | X | X |
| | | 30 | | | | O | O | O | X |
| | | 40 | | | | O | O | O | O |
| | | 50 | | | | O | O | O | O |
| | | 60 | | | | O | O | O | O |
| | | 70 | | | | O | O | O | O |
| | | 80 | | | | O | O | O | O |
| | | 90 | | | | O | O | O | O |
| | | 100 | | | | O | O | O | O |
| | | 110 | | | | O | O | O | O |
| | | 120 | | | | O | O | O | O |
| | | 130 | | | | O | O | O | O |
| | | 140 | | | | O | O | O | O |
| | | 150 | | | | O | O | O | O |
| | | 160 | | | | O | X | O | O |
| | | 170 | | | | O | X | O | O |
| | | 180 | | | | X | X | O | O |
| | 1 | 10 | 200 | 200 | 1,400 | O | O | X | X |
| | | 20 | | | | O | O | O | X |
| | | 30 | | | | O | O | O | O |
| | | 40 | | | | O | O | O | O |
| | | 50 | | | | O | O | O | O |
| | | 60 | | | | O | O | O | O |
| | | 70 | | | | O | O | O | O |
| | | 80 | | | | O | O | O | O |
| | | 90 | | | | O | O | O | O |
| | | 100 | | | | O | O | O | O |
| | | 110 | | | | O | O | O | O |
| | | 120 | | | | O | O | O | O |
| | | 130 | | | | O | O | O | O |
| | | 140 | | | | O | X | O | O |
| | | 150 | | | | O | X | O | O |
| | | 160 | | | | X | X | O | O |
| | | 170 | | | | X | X | O | O |
| | | 180 | | | | X | X | O | O |
| | 1.5 | 10 | 233 | 158 | 1,400 | O | O | O | X |
| | | 20 | | | | O | O | O | O |
| | | 30 | | | | O | O | O | O |
| | | 40 | | | | O | O | O | O |
| | | 50 | | | | O | O | O | O |
| | | 60 | | | | O | O | O | O |
| | | 70 | | | | O | O | O | O |
| | | 80 | | | | O | O | O | O |
| | | 90 | | | | O | O | O | O |
| | | 100 | | | | O | O | O | O |
| | | 110 | | | | O | O | O | O |
| | | 120 | | | | O | O | O | O |
| | | 130 | | | | O | X | O | O |
| | | 140 | | | | O | X | O | O |
| | | 150 | | | | X | X | O | O |
| | | 160 | | | | X | X | O | O |
| | | 170 | | | | X | X | O | O |
| | | 180 | | | | X | X | O | O | a case in which the array type chip resistor 100 attached to the PCB is separated has not been generated.

Therefore, in order to secure the adhesion strength capable of preventing a phenomenon in which the array type chip resistor 100 is separated, in the case in which the external impact is applied to the array type chip resistor 100 or during the handling of the user, when d1/d2 is 0.5 to 1.5, the height of the side electrode 140 needs to be 4,300/d1 μm or above.

That is, in the case in which the height of the side electrode 140 is 4,300/d1 μm or less, when the impact is applied to the array type chip resistor 100 or the array type chip resistor 100 is touched during adjustment of the substrate having the array type chip resistor 100 attached thereto, the array type chip resistor 100 may be separated, such that the defect may be generated.

Referring to table 1, in the case of a solder short or short test, it may be appreciated that as the distance d2 between the side electrodes 140 is increased, the possibility of shorts being generated is decreased.

In order to prevent a phenomenon in which the resistor 120 is broken by the impact, the resistor 120 may be formed on the lower surface of the chip body 110.

According to the related art, the side electrode 140 is extended to arrive at an upper surface or to be formed to the topmost portion of sides of the chip body 110.

In the case in which the array type chip resistor 100 having the resistor 120 formed on the lower surface thereof is mounted on the PCB, possibility that the impact is applied to the upper portion is very high. Therefore, there are many cases in which the electrode formed on the upper portion is pushed outwardly to thereby generate the short, or the electrode formed in an upper corner is pushed out to thereby generate the short.

Particularly, in order to mount the array type chip resistor 100 on the PCB, the solder is used in the side electrode, wherein the possibility that a short due to an impact on an upper or lower corner by the solder is generated is very high.

In order to prevent this, the height h of the side electrode 140 needs to be varied depending on the distance d2 between the side electrodes 140 adjacent to each other.

That is, when the distance d2 between the side electrodes 140 adjacent to each other is increased, the height h of the side electrode 140 needs to be relatively short, and when the distance d2 between the side electrodes 140 adjacent to each other is decreased, the height h of the side electrode 140 may become relatively long.

Referring to table 1, when d1/d2 is 0.5 to 1.5, in the case in which the height h of the side electrode 140 is 0.24d2+87.26 μm or less, the defect due to the solder short and the short in the short test has not been generated.

That is, in the case in which the height h of the side electrode 140 exceeds 0.24d2+87.26 μm, the height h of the side electrode 140 is too high as compared to the distance d2 between the side electrodes 140 adjacent to each other, such that even in the case in which only a small impact is applied to the array type chip resistor 100, the upper portion of the side electrode 140 or the solder S is pushed out to thereby generate the short, thereby decreasing reliability.

Therefore, in order to prevent the array type chip resistor 100 from being separated due to the external impact by securing adhesion strength while preventing shorts due to the side electrode or the solder, in the case in which d1/d2 is 0.5 to 1.5, a value of h may be 4,300/d1 μm or above and may be 0.24d2+87.26 μm or less.

By examining 1000 array type chip resistors 100, whether or not a plating defect is generated can be measured.

In the case in which the height of the side electrode is relatively low, the plating may not be properly formed, such that a plating defect may be generated.

In the array type chip resistor 100 according to another embodiment of the present invention having the value of h of 4,300/d1 μm or above, there is no chip resistor having the plating defect generated therein in 1000 array type chip resistors 100.

In a case of the array type chip resistor 100 having the value of h less than 4,300/d1 μm, it may be appreciated that as the height h of the side electrode 140 is reduced, the array type chip resistor 100 having the plating defect generated therein is increasingly increased.

An electrode strength is indicated as X in the case in which the defect is generated in one or more of 10 array type chip resistors 100 and is indicated as O in a case in which there is no defect, by heating and cooling the array type chip resistor 100 at 125° C. and −45° C., respectively for 15 minutes and performing a cycle maintaining for 3 minutes at a highest temperature and a lowest temperature 1000 times.

For cracking of the electrode after soldering, the array type chip resistor 100 is heated and cooled at 125° C. and −45° C., respectively for 15 minutes, and for 10 array type chip resistor 100, a cycle maintaining for 3 minutes at a highest temperature and a lowest temperature is performed 1000 times.

In a case of the cracking of the electrode after the soldering, when the side electrode 140 is relatively narrow and long, the cracking from the chip body 110 is generated due to stress of the solder S from the upper portion.

Therefore, for the width d1 of the side electrode 140, when the height h of the side electrode 140 is great, the electrode cracking may be generated after the soldering.

Specifically, in the case in which h is 170 μm or less, the electrode cracking is not generated when performing an electrode cracking test for 10 array type chip resistors 100.

However, in the case in which h exceeds 170 μm, the electrode cracking is generated in one or more array type chip resistors 100 among 10 array type chip resistors 100.

The values of d1 and d2 may be determined by a ratio of d1/d2 since the length l of the chip body 110 according to the embodiment of the present invention is 1400 μm.

Specifically, the width d1 of the side electrode may be 140 to 233 μm and the distance d2 between adjacent side electrodes may be 200 to 400 μm.

Figure 5:
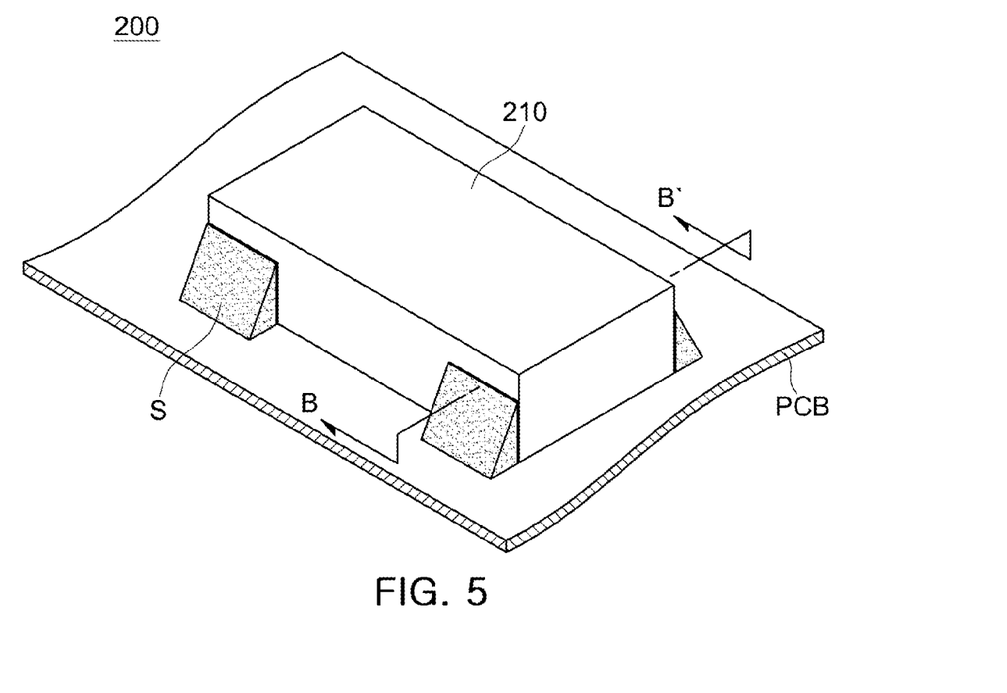
FIG. 5 is a schematic perspective view of an array type chip resistor according to another embodiment of the present invention.
Figure 6:
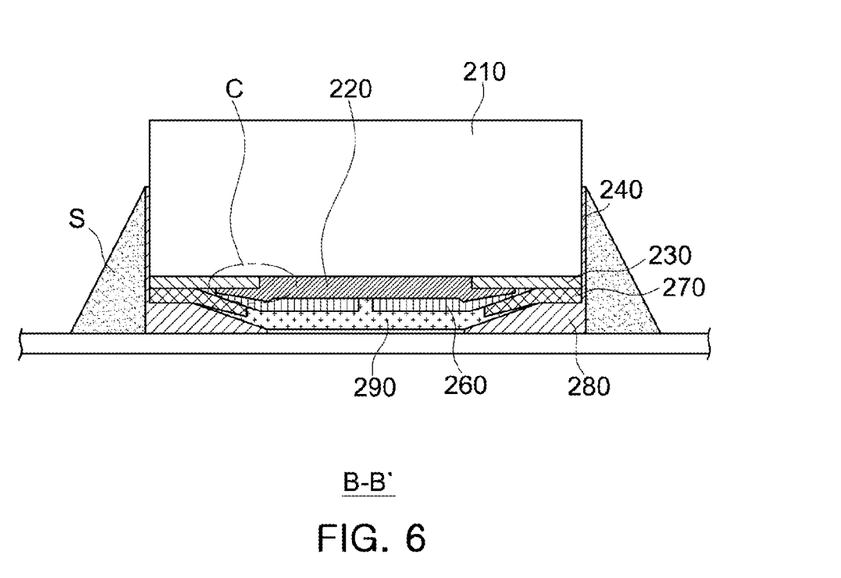
FIG. 6 is a schematic cross-sectional view taken along line B-B' of the array type chip resistor of FIG. 5.

FIG. 5 is a schematic perspective view of an array type chip resistor 200 according to another embodiment of the present invention and FIG. 6 is a schematic cross-sectional view taken along line B-B' of the array type chip resistor 200 of FIG. 5.

The array type chip resistor 200 according to another embodiment of the present invention will be described with reference to FIGS. 5 and 6.

With respect to FIGS. 5 and 5, the array type chip resistor 200 according to another embodiment of the present invention may include a chip body 210; two pairs of lower electrodes 230 disposed on both sides of a lower surface of the chip body 210 and formed so that the electrodes disposed at both end sides of the chip body are extended to edges of the chip body 210; side electrodes 240 formed by allowing the lower electrodes 230 to be extended to aside of the chip body 210; and a resistor 220 interposed between the lower electrodes 230 on the lower surface of the chip body 210 and electrically connected to the lower electrode 230 through a contact portion C.

As shown, the chip body 210 according to the embodiment of the present invention may be configured to have a thin plate shape having a rectangular parallelepiped shape and may be formed of an alumina material in which a surface thereof is anodized so as to be insulated.

In addition, as the chip body 210 is formed of a material having excellent heat conductivity, the chip body 210 serves as a thermal diffusion passage radiating heat generated from the resistor 220 at the time of performing the surface mounting of the chip body 210.

The chip body 210 may have a length l of 800 μm.

The chip body 210 may have a thickness t of 180 μm.

The lower surface of the chip body 210 is provided with a plurality of lower electrodes 230 disposed at a predetermined interval on both sides of the lower surface.

The resistor 220 mainly having ruthenium oxide (RuO) as a main component is printed on the center portion of the lower surface of the chip body 210 inwardly of the lower electrode 230.

In this case, the resistor 220 and the plurality of lower electrodes 230 disposed on the outside thereof are electrically connected to one another through the contact portion C.

When the resistor 220 is printed inwardly of the lower electrodes 230 formed on both sides of the lower surface of the chip body 210, the resistor may be printed so as to cover the portion of the lower electrode 230 in order to stably and electrically connect between the resistor 220 and the lower electrodes 230.

In addition, when mounting the array type chip resistor 200 on a printed circuit board (PCB), the lower electrode 230 faces a pad formed on the PCB so as to be electrically adhered through a solder S.

Meanwhile, a protection layer 260 for protecting the resistor 220 from external impacts may cover the resistor 220 printed so as to have a predetermined thickness between the lower electrodes 230.

In this case, the protection layer 260 may be formed of a silicon dioxide ($SiO_2$) or glass material and may be formed on the resistor 220 by over-coating.

The protection layer 260 is formed on an exposed entire surface of the resistor 220 for the purpose of protecting the resistor 220, but in order to completely seal the resistor 220, a portion inwardly of the lower electrode 230 provided at the outside of the resistor 220 may also be simultaneously covered.

The resistor 220 having the protection layer 260 formed thereon, which implements resistive characteristics by interrupting a current flow through the array type chip resistor 200 at the time of the surface mounting, needs to implement a suitable capacitance value, and may have a resistance value of a suitable capacitance by performing a trimming process through laser in order to enable the implementation of the suitable capacitance value after forming the protection layer 260.

That is, when the resistance value which may be implemented in the array type chip resistor 200 is 100Ω, since it is difficult to form the resistor 220 having a precise 100Ω at the time of printing the resistor 220, the resistor 220 is formed so as to implement a resistance value of approximately 80 to 90Ω, and a groove portion having an etched shape by trimming the resistor 220 using the laser is formed, such that the resistance value is increased and 100Ω of a design value may be implemented.

In this case, the reason that the protection layer 260 is formed on the resistor 220 and the trimming of the resistor 220 is then formed is to prevent cracking of the resistor 220 by the protection layer 260 at the time of the laser trimming process.

After forming the protection layer 260 covering the resistor 220, leveling electrodes 270 electrically contacting the lower electrodes 230 are provided.

The leveling electrode 270 may be formed on the lower electrode 230 and the edge of the protection layer 260 covering the portion of the lower electrode 230, and serves to enable a stable electrode contact by expanding a reduced effective area of the lower electrode 230.

In addition, the leveling electrode 270 is formed on the lower electrode 230 so as to have a predetermined height and the reason for forming the leveling electrode 270 in addition to the lower electrode 230 is to increase a height of a final electrode above a height of an insulating layer (described below) in addition to the resistor 220 printed on the lower surface of the chip body 210 and the protection layer 260.

That is, the height of the leveling electrode 270 should have approximately the same height as the heights of the resistor 220 and the protection layer 260 formed on the center portion of the lower surface of the chip body 210, and the leveling electrode 270 is in contact with the reduced effective area of the lower electrode 230 at the time of forming the resistor 220 and the protection layer 260 to thereby expand the area of the electrode, such that stability of the electrode is easily secured and the plating layer is then easily formed.

Meanwhile, the plating layer 280 is formed on the leveling electrode 270, for forming the final external electrode.

The plating layer 280 may be formed by sequentially performing nickel (Ni) plating and tin (Sn) plating, and the plating layer 280 may be formed through electroplating or electroless plating.

In this case, the nickel plating layer is a plating layer for protecting the leveling electrode 270 at the time of soldering, and the tin plating layer is formed for easy soldering at the time of soldering.

In addition, the array type chip resistor 200 according to the embodiment of the present invention may further include an insulating layer 290 covering an entire protection layer 260 at the time of forming the external electrode using the plating layer 280. The insulating layer 290 may be formed of glass or a polymer material similar to the protection layer 260 and finally serves to protect the resistor 220.

In addition, the insulating layer 290 completely blocks the resistor 220 from being exposed to the outside to protect the resistor 220 from the external impacts and covers the entire surface of the protection layer 260 and a portion of the leveling electrode 270 which is an additional electrode, such that when forming the plating layer 280 for forming the external electrode, a plating liquid may be prevented from being permeated into the resistor 220.

In this case, the plating layers 280 formed on both side portions of the insulating layer 290 may be formed so as to have a height greater than that of the center portion of the insulating layer 290.

The reason for forming the height of the plating layer 280 of both side portions of the insulating layer 290 to be relatively high is to enable a stable mounting at the time of mounting the array type chip resistor 200 on a main substrate (PCB) according to the embodiment of the present invention, and more specifically, to prevent a Tombstone defect from being generated, wherein the Tombstone defect indicates that the array type chip resistor 200 on the PCB is mounted to be inclined toward one side by a convex portion of the center at the time of soldering the array type chip resistor 200 in the case in which the convex center portion of the insulating layer 290 is formed to be higher than the plating layer 280.

Figure 7:
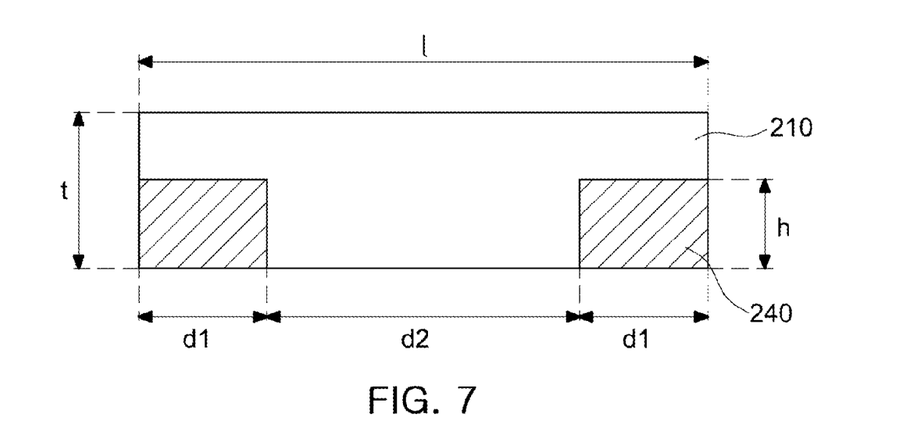
FIG. 7 is a schematic side view in a length direction 1 of the array type chip resistor of FIG. 5.

FIG. 7 is a schematic side view of the array type chip resistor of FIG. 5 in a length direction l.

When a width of the side electrode 240 is defined as d1 and a distance between the side electrodes 240 adjacent to each other is defined as d2, a height of the side electrode 240 may be defined as h.

In this case, a relationship for the height of the side electrode 240 according to the width d1 of the side electrode 240 and the distance d2 between the side electrodes 240 adjacent to each other will be described in the following table 2.

TABLE 2

| Division | d1/d2 | h (um) | d1 (um) | d2 (um) | L (um) | Sokler Short | Short | 800gf Adhesion Strength |
|---|---|---|---|---|---|---|---|---|
| Two Pairs | 0.5 | 10 | 200 | 400 | 800 | O | O | X |
| | | 20 | | | | O | O | X |
| | | 30 | | | | O | O | X |
| | | 40 | | | | O | O | O |
| | | 50 | | | | O | O | O |
| | | 60 | | | | O | O | O |
| | | 70 | | | | O | O | O |
| | | 80 | | | | O | O | O |
| | | 90 | | | | O | O | O |
| | | 100 | | | | O | O | O |
| | | 110 | | | | O | O | O |
| | | 120 | | | | O | O | O |
| | | 130 | | | | O | O | O |
| | | 140 | | | | O | O | O |
| | | 150 | | | | O | O | O |
| | | 160 | | | | O | O | O |
| | | 170 | | | | O | X | O |
| | | 180 | | | | X | X | O |
| | 1 | 10 | 267 | 267 | 800 | O | O | X |
| | | 20 | | | | O | O | X |
| | | 30 | | | | O | O | O |
| | | 40 | | | | O | O | O |
| | | 50 | | | | O | O | O |
| | | 60 | | | | O | O | O |
| | | 70 | | | | O | O | O |
| | | 80 | | | | O | O | O |
| | | 90 | | | | O | O | O |
| | | 100 | | | | O | O | O |
| | | 110 | | | | O | O | O |
| | | 120 | | | | O | O | O |
| | | 130 | | | | O | O | O |
| | | 140 | | | | O | O | O |
| | | 150 | | | | O | X | O |
| | | 160 | | | | X | X | O |
| | | 170 | | | | X | X | O |
| | | 180 | | | | X | X | O |
| | 1.5 | 10 | 300 | 200 | 800 | O | O | X |
| | | 20 | | | | O | O | X |
| | | 30 | | | | O | O | O |
| | | 40 | | | | O | O | O |
| | | 50 | | | | O | O | O |
| | | 60 | | | | O | O | O |
| | | 70 | | | | O | O | O |
| | | 80 | | | | O | O | O |
| | | 90 | | | | O | O | O |
| | | 100 | | | | O | O | O |
| | | 110 | | | | O | O | O |
| | | 120 | | | | O | O | O |
| | | 130 | | | | O | O | O |
| | | 140 | | | | O | X | O |
| | | 150 | | | | O | X | O |
| | | 160 | | | | X | X | O |
| | | 170 | | | | X | X | O |
| | | 180 | | | | X | X | O |

A short test and a short test by a solder between the electrodes are indicated as X in the case in which shorts are generated, and are indicated as O in the case in which shorts are not generated at the time of testing the short by external forcible impact.

The adhesion strength is indicated as X in the case in which at least one of 10 samples is separated and is indicated as O in the case in which no samples are separated, when force of 800 gf is applied to the array type chip resistor 200 attached to the PCB.

Referring to table 2, it may be appreciated that as the height h of the side electrode 240 is increased, the adhesion strength is increased in the case in which the force of 800 gf is applied.

Particularly, when one side electrode 240 has an area of 7,000 $\mu m^2$ or more, even when the force of 800 gf is applied, a case in which the array type chip resistor 200 attached to the PCB is separated has not been generated.

Therefore, in order to secure adhesion strength capable of preventing a phenomenon in which the array type chip resistor 200 is separated, in the case in which the external impact is applied to the array type chip resistor 200 or during the handling of the user, when d1/d2 is 0.5 to 1.5, the height of the side electrode 240 needs to be 7,000/d1 μm or above.

That is, in the case in which the height of the side electrode 240 is 7,000/d1 μm or less, when the impact is applied to the array type chip resistor 200 or the array type chip resistor 200 is touched during adjustment of the substrate having the array type chip resistor 200 attached thereto, the array type chip resistor 200 is separated, such that the defect may be generated.

Referring to table 2, in the case of a solder short or short test, it may be appreciated that as the distance d2 between the side electrodes 240 is increased, the possibility of shorts being generated is decreased.

In order to prevent a phenomenon in which the resistor 220 is broken by the impact, the resistor 220 may be formed on the lower surface of the chip body 210.

According to the related art, the side electrode 240 is extended to arrive at an upper surface or to be formed to the topmost portion of sides of the chip body 210.

In the case in which the array type chip resistor 200 having the resistor 220 formed on the lower surface thereof is mounted on the PCB, possibility that the impact is applied to the upper portion is relatively very high. Therefore, there are many cases in which the electrode formed on the upper portion is pushed outwards to thereby generate the short, or the electrode formed in an upper corner is pushed out to thereby generate the short.

Particularly, in order to mount the array type chip resistor 200 on the PCB, the solder is used in the side electrode, wherein possibility that the short due to the impact at an upper or lower corner by the solder is generated is very high.

In order to prevent this, the height h of the side electrode 240 needs to be varied depending on the distance d2 between the side electrodes 240 adjacent to each other.

That is, when the distance d2 between the side electrodes 240 adjacent to each other is increased, the height h of the side electrode 240 needs to be short, and when the distance d2 between the side electrodes 240 adjacent to each other is decreased, the height h of the side electrode 240 may become long.

Referring to table 2, when d1/d2 is 0.5 to 1.5, in the case in which the height h of the side electrode 240 is 0.15d2+105 μm or less, the defect due to the solder short and the short in the short test has not been generated.

That is, in the case in which the height h of the side electrode 240 exceeds 0.15d2+105 μm, the height h of the side electrode 240 is too high as compared to the distance d2 between the side electrodes 240 adjacent to each other, such that even in the case in which only a small impact is applied to the array type chip resistor 200, the upper portion of the side electrode 240 or the solder S is pushed out to thereby generate the short, thereby decreasing reliability.

Therefore, in order to prevent the array type chip resistor 200 from being separated due to the external impact by securing the adhesion strength while preventing the short due to the side electrode or the solder, in the case in which d1/d2 is 0.5 to 1.5, a value of h may be 7,000/d1 μm or above and may be 0.15d2+105 μm or less.

By examining 1000 array type chip resistors 200, whether or not a plating defect is generated has been measured.

In the case in which the height of the side electrode is relatively low, the plating is not properly formed, such that the plating defect may be generated.

In the array type chip resistor 200 according to another embodiment of the present invention having the value of h of 7,000/d1 μm or above, there is no chip resistor having the plating defect generated therein in 1000 array type chip resistors 200.

In a case of the array type chip resistor 200 having the value of h less that 7,000/d1 μm, it may be appreciated that as the height h of the side electrode 240 is reduced, the array type chip resistor 200 having the plating defect generated therein is increasingly increased.

An electrode strength is indicated as X in the case in which the defect is generated in one or more of 10 array type chip resistors 200 and is indicated as O in which there is no defect, by heating and cooling the array type chip resistor 200 at 125° C. and −45° C., respectively for 15 minutes and performing a cycle maintaining for 3 minutes at a highest temperature and a lowest temperature 1000 times.

For cracking of the electrode after soldering, the array type chip resistor 200 is heated and cooled at 125° C. and −45° C., respectively for 15 minutes, and for 10 array type chip resistor 200, a cycle maintaining for 3 minutes at a highest temperature and a lowest temperature is performed 1000 times.

In a case of the cracking of the electrode after the soldering, when the side electrode 240 is relatively narrow and long, the cracking from the chip body 210 is generated due to stress of the solder S from the upper portion.

Therefore, for the width d1 of the side electrode 240, when the height h of the side electrode 240 is relatively great, the electrode cracking may be generated after the soldering.

Specifically, in the case in which h is 170 μm or less, the electrode cracking is not generated when performing an electrode cracking test for 10 array type chip resistors 200.

However, in the case in which h exceeds 170 μm, the electrode cracking is generated in one or more array type chip resistors 200 among 10 array type chip resistors 200.

The values of d1 and d2 may be determined by a ratio of d1/d2 since the length l of the chip body 210 according to the embodiment of the present invention is 800 μm.

Specifically, the width d1 of the side electrode may be 200 to 300 μm and the distance d2 between adjacent side electrodes may be 200 to 400 μm.

Figure 8:
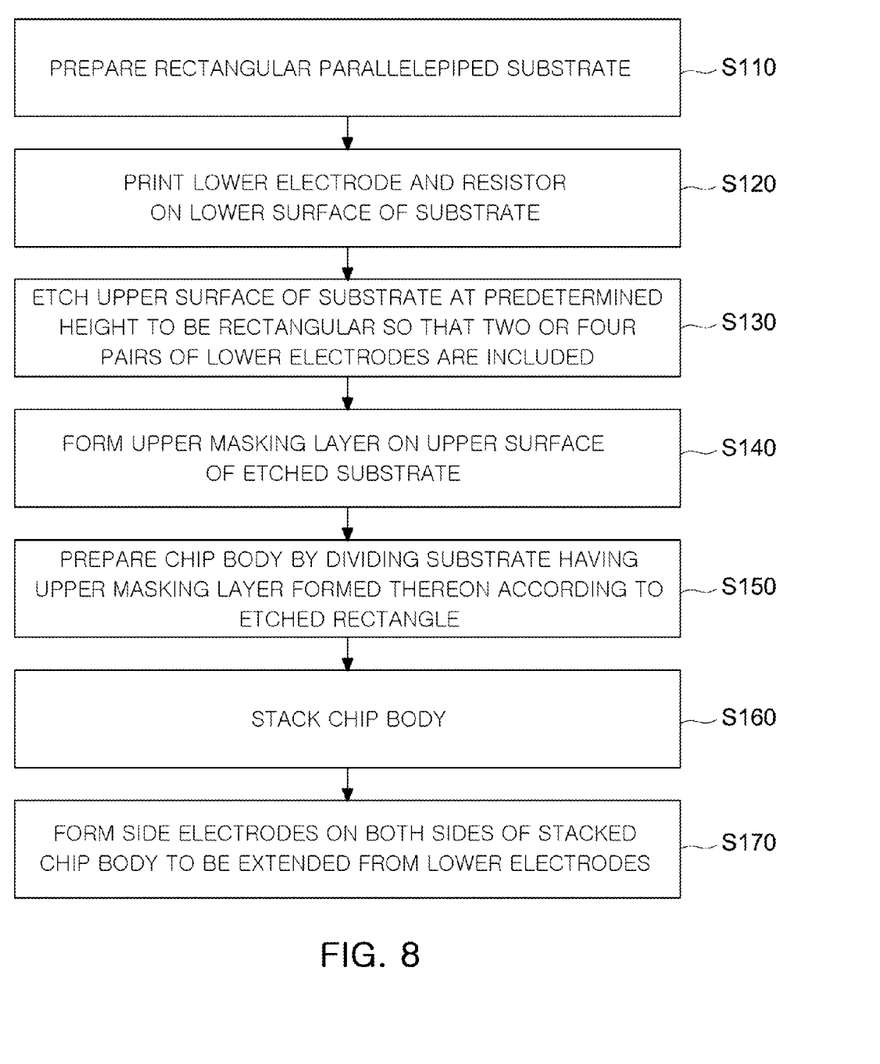
FIG. 8 is a schematic flow chart for a method of manufacturing an array type chip resistor according to an embodiment of the present invention.

FIG. 8 is a schematic flow chart for a method of manufacturing the array type chip resistors 100 and 200 according to an embodiment of the present invention.

Referring to FIG. 8, the method of manufacturing the array type chip resistor according to an embodiment of the present invention may includes preparing a substrate S110; printing a lower electrode and a resistor on a lower surface of the substrate S120; etching an upper surface of the substrate at a predetermined height so as to have a shape in which two or four pairs of lower electrodes are included S130; forming an upper masking layer on the upper surface of the etched substrate S140; preparing a chip body by dividing the substrate having the masking layer formed thereon according to the etched shape S150; stacking the chip body S160; and forming side electrodes on both sides of the stacked chip body to be extended from the lower electrodes S170.

The upper masking layer may be formed by selecting a chemical masking material or a physical masking material capable of easily performing attachment and cleaning.

The upper masking layer may be formed of at least one selected from a group consisting of photo-hardener or paste for masking, but is not limited thereto.

The paste for masking may include ethyl cellulose and additives (glass frit, ceramic powder).

Particularly, in a case of using the paste for masking, the paste for masking is easily cleaned by water ($H_2O$), NaOH, $C_2H_5OH$, and the like, such that it may be easily removed.

In the case of the paste for masking, the paste may be easily applied in a spraying, printing, or spin coating scheme, but is not limited thereto.

The paste for masking may form a side masking layer at a portion in which the side electrode 140 is not required to be formed therein, in an appropriate method and condition.

A method for forming the side electrode will specifically be described. The side electrode may have an appropriate height by the etching of the upper surface of the substrate S130 and the forming of the upper masking layer S140.

That is, a depth of etching in the etching of the upper surface of the substrate S130 is performed to etch the substrate by a value obtained by subtracting the height h of the side electrode to be formed, from a thickness t of the chip body.

Next, after the upper masking layer is formed on an entire surface or the etched portion of the upper portion of the substrate S140, the chip body is prepared by dividing the substrate and the chip body is stacked S150 and S160.

In this case, viewing a cross-section of the stacked chip body, it may be appreciated that the upper masking layer is formed on the upper surface and the etched portion of the chip body or only on the etched portion since the upper masking layer is formed after the substrate is etched by the value subtracting the height h of the side electrode to be formed, from the thickness t of the chip body.

Therefore, in a case of performing the forming of the side electrode at the side of the stacked chip body S170, since the side electrode is not formed at the etched portion by the upper masking layer formed at the etched portion, the side electrode having a height as required may be easily formed.

In order to secure the adhesion strength of the completed array type chip resistor to thereby prevent the array type chip resistor from being separated due to the external impact and prevent the short caused by the side electrode or the solder, the height of the side electrode may be formed as follows.

First, in a case of etching the upper surface of the substrate at a predetermined height so as to have four pairs of lower electrodes, when the width of the side electrode is defined as d1, the distance between adjacent side electrodes is defined as d2, the height of the side electrode is defined as h, and the thickness of the substrate is defined as t, the etched height of the substrate may be t−(0.24d2+87.26) μm or above and may be t−(4,300/d1) μm or less.

Second, in a case of etching the upper surface of the substrate at a predetermined height so as to have two pairs of lower electrodes, when the width of the side electrode is defined as d1, the distance between adjacent side electrodes is defined as d2, the height of the side electrode is defined as h, and the thickness of the substrate is defined as t, the etched height of the substrate may be t−(0.15d2+105) μm or above and may be t−(7,000/d1) μm or less.

According to the embodiment of the present invention, the forming of the side electrode S170 may be performed to include forming a side masking layer between adjacent side electrodes; and forming the side electrode at the side of the stacked chip body having the masking layer formed thereon.

The side masking layer may be formed by selecting a chemical mask material or a physical mask material capable of being easily attached and cleaned.

The side masking layer may be formed of at least one selected from a group consisting of photo-hardener or paste for masking, but is not limited thereto.

The paste for masking may include ethyl cellulose and additives (glass frit or ceramic powder).

Particularly, in a case of using the paste for masking, the paste for masking is easily cleaned by water ($H_2O$). NaOH, $C_2H_5OH$, and the like, such that it may be easily removed.

In the case of the paste for masking, it may be easily applied in a spray, printing, or spin coating scheme, but is not limited thereto.

The paste for masking may form a side masking layer at a portion in which the side electrode 140 is not required to be formed, in an appropriate method and condition.

In addition, in a case of using the photo-hardener, the forming of the side masking layer may appropriately be performed at a portion in which the electrode is not required to be formed or at a portion in which the electrode is required to be formed, according to whether the photo-hardener is a positive photo-hardener or a negative photo-hardener.

That is, in a case of the positive photo-hardener, after the side masking layer 150 is formed at the side of the chip body 110, a source reacting with the photo-hardener is applied to the portion in which the side electrode 140 is formed and the source may be then removed in a physical or chemical method.

That is, in a case of the negative photo-hardener, unlike the positive photo-hardener, a source reacting with the photo-hardener is applied to the portion in which the side electrode 140 is not formed and the source may be then removed in a physical or chemical method.

After the side masking layer is appropriately formed, the forming of the side electrode may be easily performed using a method such as a sputtering, a dipping, a printing, or the like.

According to the related art, the side electrode is formed in a scheme in which the mask is formed and sputtering is performed, other than forming the masking layer in order to form the side electrode.

In this case, a sputtered material is also deposited on the mask, thereby gradually decreasing an interval between the masks.

Further, in a case of forming the side electrode by a method according to the related art, when the side electrode is not formed in a required shape, all of the stacked chip bodies need to be discarded, such that yield may be decreased.

However, since the method of manufacturing the array type chip resistor according to the embodiment of the present invention uses the material capable of being easily removed, when the mask is not formed in a required side electrode shape, after the cleaning is performed, the process may be again performed, such that the yield may be increased.

In addition, since a problem in that the sputtered material is deposited on the mask and the shape of the mask is changed as in the case according to the related art does not occur, uniformity of the shape of the side electrode may be guaranteed.

The method of manufacturing the array type chip resistor according to the embodiment of the present invention may further include removing the upper masking layer and the side masking layer.

The removing of the masking layers may be performed using a chemical or physical method according to a material used.

The present invention is not limited to those described above and specifically, the width of the side electrode, the interval between the side electrodes, the height between the side electrodes, and the like formed in the array type chip resistor may be formed differently within a range satisfying a numerical range of the present invention.

For example, in the array type chip resistor including four pairs of side electrodes formed therein, the width of the side electrode disposed on an end is formed to be relatively wide, and the width of the side electrode disposed in the center portion is formed to be relatively narrow, such that the adhesion strength may be secured and a wider electrode interval may be secured.

As set forth above, according to the embodiment of the present invention, by setting heights of the side electrodes according to the width of the side electrode and the interval between adjacent side electrodes in the array type chip resistor, the adhesion strength of the array type chip resistor is secured and the short between the side electrodes which may be generated at the time of external impact or a handling of a user is prevented, such that reliability of the array type chip resistor may be secured.

While the present invention has been shown and described in connection with the embodiments, it will be apparent to those skilled in the art that modifications and variations can be made without departing from the spirit and scope of the invention as defined by the appended claims.

What is claimed is:

1. An array type chip resistor, comprising:
   a chip body;
   four pairs of lower electrodes disposed on both sides of a lower surface of the chip body and formed so as to be extended to edges of the chip body;
   side electrodes formed so that the lower electrodes are extended to sides of the chip body; and
   a resistor interposed between the lower electrodes on the lower surface of the chip body and electrically connected to the lower electrode through a contact portion,
   wherein when a width of the side electrode is defined as d1, a distance between adjacent side electrodes is defined as d2, and a height of the side electrode is defined as h, in the case in which d1/d2 is 0.5 to 1.5, a value of h is 4,300/d1 μm or above and is 0.24d2+87.26 μm or less.

2. The array type chip resistor of claim 1, wherein the chip body has a length l of 1400 μm.

3. The array type chip resistor of claim 1, wherein the side electrode has the width d1 of 140 to 233 μm.

4. The array type chip resistor of claim 1, wherein the distance d2 between adjacent side electrodes is 200 to 400 μm.

5. The array type chip resistor of claim 1, wherein the contact portion has the resistor formed below the lower electrode.

6. The array type chip resistor of claim 1, wherein the contact portion has the lower electrode formed below the resistor.

7. The array type chip resistor of claim 1, further comprising:
   a protection layer covering the resistor and having both sides simultaneously covering a portion of the lower electrode;
   a leveling electrode being in contact with the lower electrode exposed to an outer side of the protection layer;
   a plating layer formed on the leveling electrode; and an insulating layer covering the protection layer on the underside thereof.

8. The array type chip resistor of claim 1, wherein a width of the side electrode disposed on an end of the chip body and a width of the side electrode disposed in the center portion among the four pairs of side electrodes are different from each other.

9. An array type chip resistor, comprising:
a chip body;
two pairs of lower electrodes disposed on both sides of a lower surface of the chip body and formed so as to be extended to edges of the chip body;
side electrodes formed so that the lower electrodes are extended to sides of the chip body; and
a resistor interposed between the lower electrodes on the lower surface of the chip body and electrically connected to the lower electrode through a contact portion,
wherein when a width of the side electrode is defined as d1, a distance between adjacent side electrodes is defined as d2, and a height of the side electrode is defined as h, in the case in which d1/d2 is 0.5 to 1.5, a value of h is 7,000/d1 μm or above and is 0.15d2+105 μm or less.

10. The array type chip resistor of claim 9, wherein the chip body has a length of 800 μm.

11. The array type chip resistor of claim 9, wherein the side electrode has the width d1 of 200 to 300 μm.

12. The array type chip resistor of claim 9, wherein the distance d2 between adjacent side electrodes is 200 to 400 μm.

13. The array type chip resistor of claim 9, wherein the contact portion has the resistor formed below the lower electrode.

14. The array type chip resistor of claim 9, wherein the contact portion has the lower electrode formed below the resistor.

15. The array type chip resistor of claim 9, further comprising:
a protection layer covering the resistor and having both sides simultaneously covering a portion of the lower electrode;
a leveling electrode being in contact with the lower electrode exposed to an outer side of the protection layer;
a plating layer formed on the leveling electrode; and
an insulating layer covering the protection layer on the underside thereof.

\* \* \* \* \*